United States Patent [19]

Manning

[11] Patent Number: 5,652,724

[45] Date of Patent: Jul. 29, 1997

[54] BURST EDO MEMORY DEVICE HAVING PIPELINED OUTPUT BUFFER

[75] Inventor: Troy A. Manning, Boise, Id.

[73] Assignee: Micron Technology, Inc., Boise, Id.

[21] Appl. No.: 386,563

[22] Filed: Feb. 10, 1995

Related U.S. Application Data

[63] Continuation-in-part of Ser. No. 370,761, Dec. 23, 1994, Pat. No. 5,526,320.

[51] Int. Cl.$^6$ ........................................ G11C 7/00
[52] U.S. Cl. ........................ 365/189.05; 365/233
[58] Field of Search ...................... 365/189.05, 233, 365/238.5; 326/82, 83

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/243 |
| 4,562,555 | 12/1985 | Ouchi et al. | 365/189.03 |
| 4,567,579 | 1/1986 | Patel et al. | 365/189.05 |
| 4,575,825 | 3/1986 | Ozaki et al. | 365/189.08 |
| 4,603,403 | 7/1986 | Toda | 365/189.05 |
| 4,618,947 | 10/1986 | Tran et al. | 365/230.08 |
| 4,649,522 | 3/1987 | Kirsch | 365/189.05 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,875,192 | 10/1989 | Matsumoto | 365/193 |
| 5,058,066 | 10/1991 | Yu | 365/189.05 |
| 5,267,200 | 11/1993 | Tobita | 365/189.05 |
| 5,268,865 | 12/1993 | Takasugi | 365/189.05 |
| 5,311,471 | 5/1994 | Matsumoto | 365/189.05 |
| 5,325,330 | 6/1994 | Morgan | 365/189.05 |
| 5,325,502 | 6/1994 | McLaury | 395/425 |
| 5,331,593 | 7/1994 | Merritt | 365/189.05 |
| 5,357,469 | 10/1994 | Sommer et al. | 365/193 |
| 5,392,239 | 2/1995 | Margulis et al. | 365/189 |

OTHER PUBLICATIONS

Mosel–Vitelic V53C8257H DRAM Specification Sheet, 20 pgs.

Primary Examiner—A. Zarabian
Attorney, Agent, or Firm—Schwegman, Lundberg, Woessner & Kluth, P.A.

[57] ABSTRACT

An integrated circuit memory device is designed for high speed data access and for compatibility with existing memory systems. An address strobe signal is used to latch a first address. During a burst access cycle the address is incremented internal to the device with additional address strobe transitions. A new memory address is only required at the beginning of each burst access. Read/Write commands are issued once per burst access eliminating the need to toggle the Read/Write control line at the device cycle frequency. Transitions of the Read/Write control line during a burst access will terminate the burst access, reset the burst length counter and initialize the device for another burst access. A two stage pipelined output buffer latches read data in a first stage while data from a second stage is driven from the device. Internal read lines may become invalid in preparation for additional access cycles after the data is latched in the first stage. The device is compatible with existing Extended Data Out DRAM device pinouts, Fast Page Mode and Extended Data Out Single In-Line Memory Module pinouts, and other memory circuit designs.

10 Claims, 6 Drawing Sheets

BURST EDO MEMORY DEVICE HAVING PIPELINED OUTPUT BUFFER

CROSS REFERENCE TO RELATED APPLICATION

This is a continuation-in-part to U.S. patent application Ser. No. 08/370,761, filed Dec. 23, 1994, now U.S. Pat. No. 5,526,320.

FIELD OF THE INVENTION

This invention relates to memory device architectures designed to provide high density data storage with high speed read and write access cycles. This invention relates more specifically to memory data read circuitry for burst access memory devices.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (/RAS) is used to latch a row address portion of a multiplexed DRAM address. Multiple occurrences of the column address strobe (/CAS) are then used to latch multiple column addresses to access data within the selected row. On the falling edge of /CAS an address is latched, and the DRAM outputs are enabled. When /CAS transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The /CAS signal for the odd addresses is mined off (high) when the /CAS signal for the even addresses is mined on (low). This interleaved memory system provides data access at twice the rate of either device alone. If the first /CAS is low for 20 nanoseconds and then high for 20 nanoseconds while the second /CAS goes low, data can be accessed every 20 nanoseconds or 50 megahertz. If the access time from /CAS to data valid is fifteen nanoseconds, the data will be valid for only five nanoseconds at the end of each 20 nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low transition occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each SDRAM device in a memory system, it is highly loaded, and it is always toggling circuitry in every SDRAM. SDRAMs also have a clock enable pin, a chip select pin and a data mask pin. Other signals which appear to be similar in name to those found on standard DRAMs have dramatically different functionality on a SDRAM.

The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacitive loads on the signal lines. The Single In-Line Memory Module (SIMM) provides an example of what has become an industry standard form of packaging memory in a computer system. On a SIMM, all address lines connect to all DRAMs. Further, the row address strobe (/RAS) and the write enable (/WE) are often connected to each DRAM on the SIMM. These lines inherently have high capacitive loads as a result of the number of device inputs driven by them. SIMM devices also typically ground the output enable (/OE) pin making /OE a less attractive candidate for providing extended functionality to the memory devices.

There is a great degree of resistance to any proposed deviations from the standard SIMM design due to the vast number of computers which use SIMMs. Industry's resistance to radical deviations from the standard, and the inability of current systems to accommodate the new memory devices will delay their widespread acceptance. Therefore only limited quantities of devices with radically different architectures will be manufactured initially. This limited manufacture prevents the reduction in cost which typically can be accomplished through the manufacturing improvements and efficiencies associated with a high volume product.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and data is input and output relative to the /CAS control signal. In the burst mode of operation the address is incremented internal to the device eliminating the need for external address lines to switch at high frequencies. Read /Write commands are issued once per burst access eliminating the need to toggle the Read /Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus. A data output buffer has a two stage pipeline mode of operation which allows for further speed increases by latching read data in an intermediate data latch, and allowing internal read signals to precharge prior to latching the data in an output latch and driving the data from the part. Internal circuitry of the memory device is largely compatible with existing Extended Data Out (EDO) DRAMs. This similarity allows the two part types to be manufactured on one die with a limited amount of additional circuitry. The ability to switch between a standard non-burst mode and a high speed burst mode allows the device to be used to replace standard devices, and eliminates the need to switch to more complex high speed memory devices. Internal address generation with a pipelined data output provides for faster data access times than is possible with either fast page mode or EDO DRAMs. This high speed operation eliminates the need to interleave memory devices in order to attain a high data throughput. In contrast to the 50 megahertz interleaved memory system described above, the output data from this device will be valid for approximately 15 nanoseconds significantly easing the design of circuitry required to latch the data from the memory. Operating frequencies significantly higher than 50 megahertz are possible with this architecture due to internal address generation, pipelined read circuitry, an extended valid data output period, and a single lightly loaded control signal operating at the operating frequency or one half of the operating frequency. The device is compatible with existing memory module pinouts including Single In-Line Memory Module (SIMM), Multi-Chip Module (MCM) and Dual In-Line Memory Module (DIMM) designs. This combination of features allows for significant system performance improvements with a minimum of design alterations.

BRIEF DESCRIPTION OF THE DRAWINGS

The features of the invention as well as objects and advantages will be best understood by reference to the appended claims, detailed description of particular embodiments and accompanying drawings where:

DETAILED DESCRIPTION OF THE PREFERRED EMBODIMENTS

Figure 1:
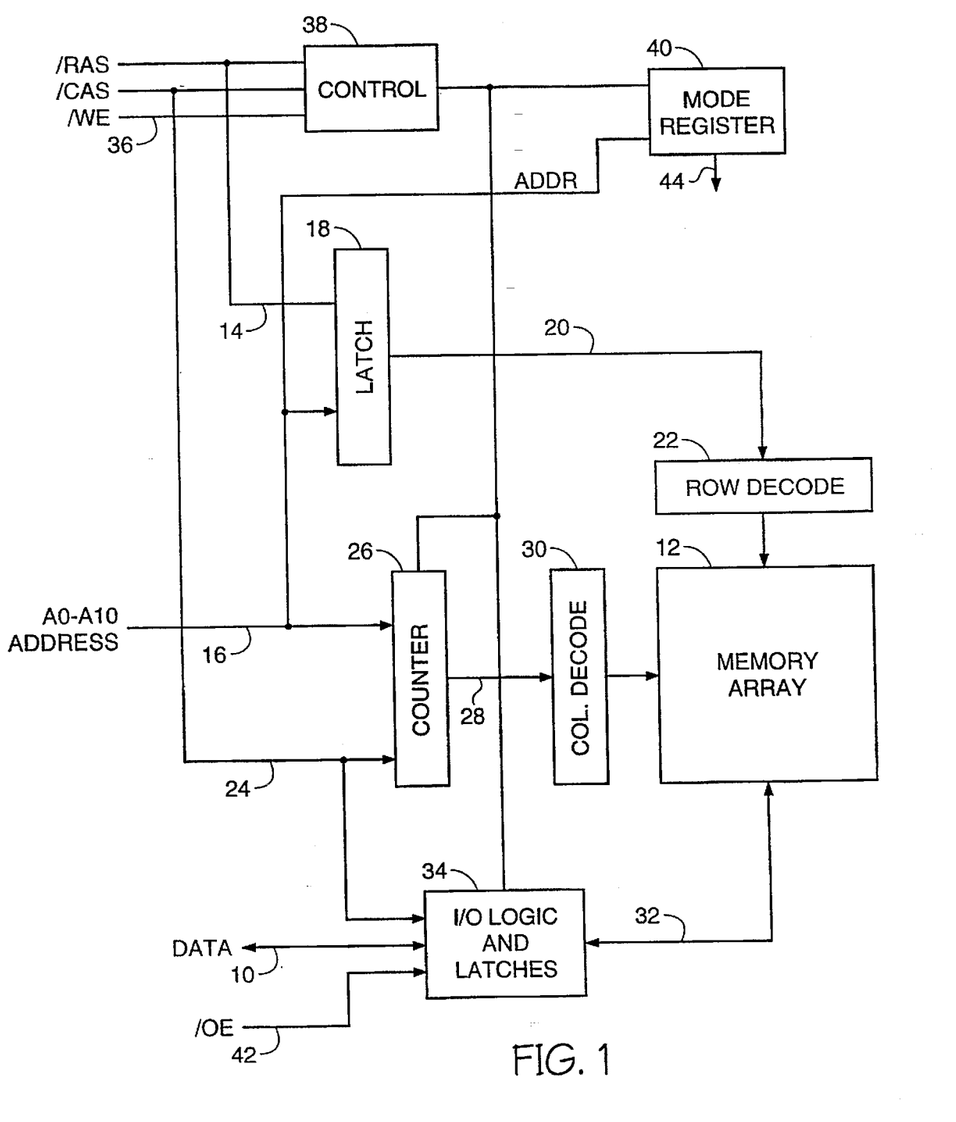
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. For the purposes of this specification, the term input may be, but is not limited to, an input signal or a point in a circuit for receiving an input signal. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, a first /CAS falling edge is used to latch an initial address for a burst access. The first burst data from the memory is latched in an intermediate latch shortly after it becomes valid on internal data lines. The data from the intermediate data latch is then latched in the output latch and driven from the memory after the second /CAS falling edge, and remains valid through the third /CAS falling edge. Latching the data in an intermediate latch allows for access cycles to begin immediately after each /CAS low transition. Once the memory device begins to output data in a burst read cycle, the output drivers 34 will continue to drive the data lines without tri-stating the data outputs during /CAS high intervals dependent on the state of the output enable and write enable (/OE and /WE) control lines, thus allowing additional time for the system to latch the output data. Once a row and a column address are selected, additional transitions of the /CAS signal are used to advance the column address within the column address counter in a predetermined sequence. The time at which data will be valid at the outputs of the burst EDO DRAM is dependent only on the timing of the /CAS signal provided that /OE is maintained low, and /WE remains high. The output data signal levels may be driven in accordance with standard CMOS, TTL, LVTTL, GTL, or HSTL output level specifications.

The address may be advanced linearly, or in an interleaved fashion for maximum compatibility with the overall system requirements. The column address may be advanced with each /CAS transition, each pulse, or multiple of /CAS pulses in the event that more than one data word is read from the array with each column address. When the address is advanced with each transition of the /CAS signal, data is also latched in the intermediate latch, latched in the output latch and driven from the part after each /CAS transition. In this case, the device latency is referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the /CAS signal.

It may be desirable to latch and increment the column address after the first /CAS falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is then used to select between odd and even halves while the other column address bits select a column within each of the array halves. In an interleaved access mode with column address 1, data from columns 0 and 1 would be read and the data from column 1 would be output followed by the data from column 0 in accordance with standard interleaved addressing as described in SDRAM specifications. In a linear access mode column address 1 would be applied to the odd array half, and incremented to address 2 for accessing the even array half to fulfill the two word access. One method of implementing this type of device architecture is to provide a column address incrementing circuit between the column address counter and the even array half. The incrementing circuit would increment the column address only if the initial column address in a burst access cycle is odd, and the address mode is linear. Otherwise the incrementing circuit would pass the column address unaltered. For a design using a prefetch of two data accesses per cycle, the column address would be advanced once for every two active edges of the /CAS signal. Read data is latched in the intermediate latch, and a multiplexer is placed between multiple intermediate latches and an output latch to provide data to the output latch in the proper sequence. Prefetch architectures where more than two data words are accessed are also possible.

In the burst access memory device, each new column address from the column address counter is decoded and is used to access additional data within the memory array without the requirement of additional column addresses being specified on the address inputs 16. This burst sequence of data will continue for each /CAS falling edge until a predetermined number of data accesses equal to the burst length has occurred. A /CAS falling edge received after the last burst address has been generated will latch another column address from the address inputs 16 and a new burst sequence will begin. Read data is latched in the output latch and driven from the device with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occured, a subsequent /CAS pulse will latch a new beginning column address, and another burst read or write access will begin.

The memory device of FIG. 1 may include the option of switching between burst EDO and standard EDO modes of operation. In this case, the write enable signal /WE 36 may be used at the row address latch time (/RAS falling, /CAS high) to determine whether memory accesses for that row will be burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiting the data output drivers 34 to place the data lines 10 in a high impedance state between data read cycles while /RAS is low. DRAM control circuitry 38, in addition to performing standard DRAM control functions, controls the I/O circuitry 34 and the column address counter/latch 26 in accordance with the mode selected by /WE when /RAS falls. For EDO page mode cycles, the intermediate data latch is bypassed in the output buffer circuitry and data is latched directly in the output latch. In a burst mode only DRAM, or in a device designed with an alternate method of switching between burst and non-burst access cycles, the state of /WE when /RAS fails may be used to switch between other possible modes of operation such as interleaved versus linear addressing modes.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access will terminate the burst access, preventing further writes from occurring. A high to low transition on /WE within a burst read access will likewise terminate the burst read access and will place the data output 10 in a high impedance state. Transitions of the /WE signal may be locked out during critical timing periods within an access cycle in order to reduce the possibility of triggering a false write cycle. After the critical timing period the state of /WE will determine whether a burst access continues, is initiated, or is terminated. Termination of a burst access resets the burst length counter and places the DRAM in a state to receive another burst access command. Both /RAS and /CAS going high during a burst access will also terminate the burst access cycle placing the data drivers in a high impedance output state, and resetting the burst length counter. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE will transition from high to low to terminate a first burst read, and then /WE will transition back high prior to the next falling edge of /CAS in order to specify a new burst read cycle. For burst writes, /WE would transition high to terminate a current burst write access, then back low prior to the next falling edge of /CAS to initiate another burst write access.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which will prevent data from being driven from the part in a read cycle if it is inactive (high) prior to /CAS falling and remains inactive beyond CAS rising. If these setup and hold conditions are not met, then the read data may be driven for a portion of the read cycle. It is possible to synchronize the /OE signal with /CAS, however this would typically increase the /CAS to data valid delay time and doesn't allow for the read data to be disabled prior to /RAS high without an additional /CAS low pulse which would otherwise be unnecessary. In a preferred embodiment, if /OE transitions high at any time during a read cycle the outputs will remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. For a latency of 1, the intermediate data latch is bypassed. For a latency of 3, an additional pipeline stage may be added. It may be desirable to place this additional pipeline stage in the address path, or in the read data path between the memory array and the first intermediate data latch. Other burst length and latency options may be provided as the operating speeds of the device increase, and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only one /CAS signal needs to toggle. The second /CAS may remain high or toggle with the other /CAS. During burst read cycles, all sixteen data bits will be driven out of part during a read cycle even if one /CAS remains inactive. In a typical system application, a microprocessor reads all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. The two /CAS's are combined in an AND function to provide a single internal /CAS which will go low when the first external /CAS falls, and returns high after the last external /CAS goes high. All sixteen data inputs are latched when the first of the /CAS signals transitions low. If only one /CAS signal transitions low, then the eight bits of data associated with the /CAS that remained high are not stored in the memory.

The present invention has been described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

It should be noted that the pinout for this new burst EDO memory device may be identical to the pinout for a standard EDO DRAM. The common pinout allows this new device to be used in existing memory designs with minimum design changes. The common pinout also allows for ease of new designs by those of skill in the art who are familiar with the standard EDO DRAM. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 2:
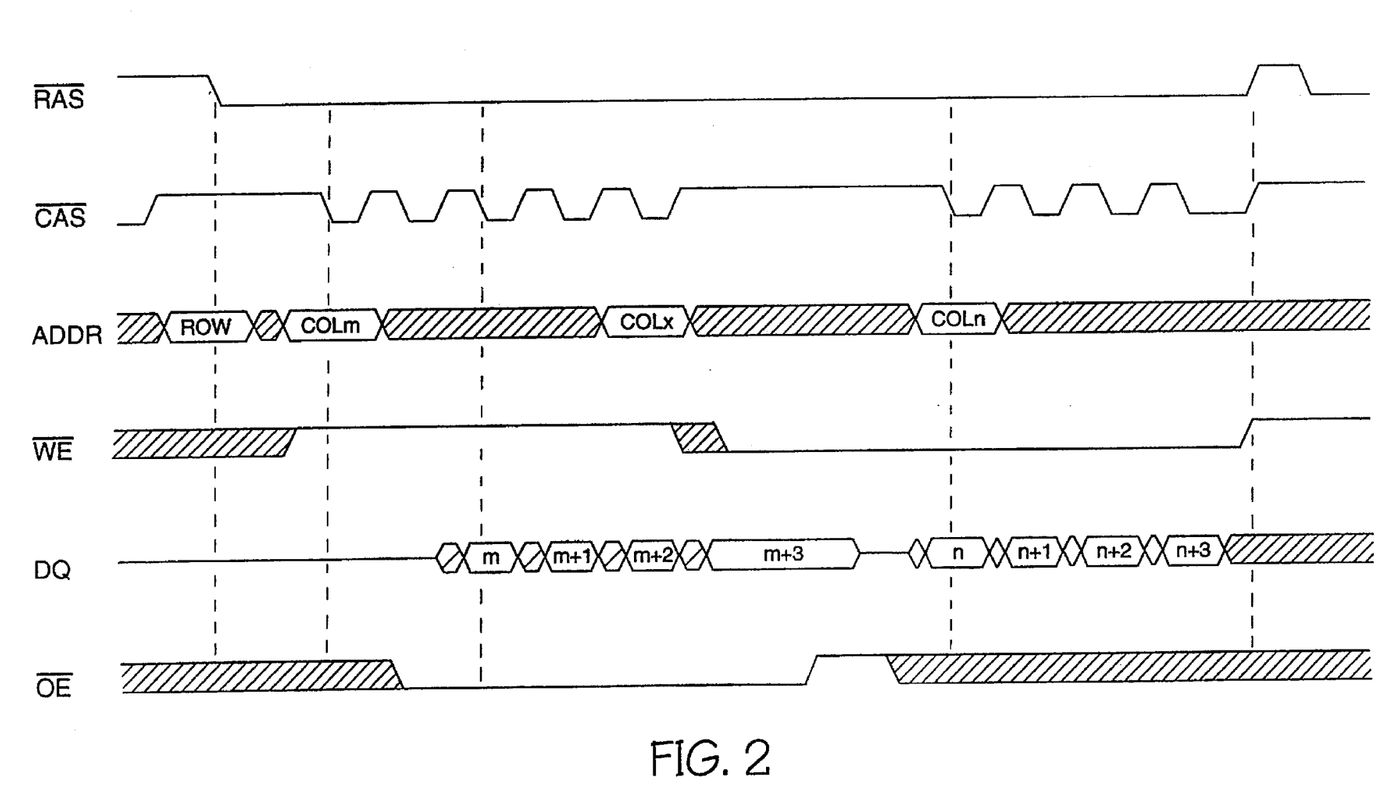
FIG. 2 is a timing diagram for a method of accessing the device of FIG. 1.

FIG. 2 is a timing diagram for performing a burst read followed by a burst write of the device of FIG. 1. In FIG. 2, a row address is latched by the /RAS signal. /WE is low when /RAS falls for an embodiment of the design where the state of the /WE pin is used to specify a burst access cycle at /RAS time. Next, /CAS is driven low with /WE high to initiate a burst read access, and the column address is latched. The data out signals (DQ's) are not driven in the first /CAS cycle, however the data is latched in the intermediate data latch once it becomes valid internally. On the second falling edge of the /CAS signal, the internal address generation circuitry advances the column address and begins another access of the array, and the first data out is latched in the output latch and driven from the device within a /CAS to data access time (tCAC). Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth failing edge of /CAS with /WE low is used to latch a new burst address, latch input data and begin a burst write access of the device. Additional input data values are latched on successive /CAS falling edges until /RAS rises to terminate the burst access.

It should be noted from FIG. 2, that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access relative to /CAS.

Figure 3:
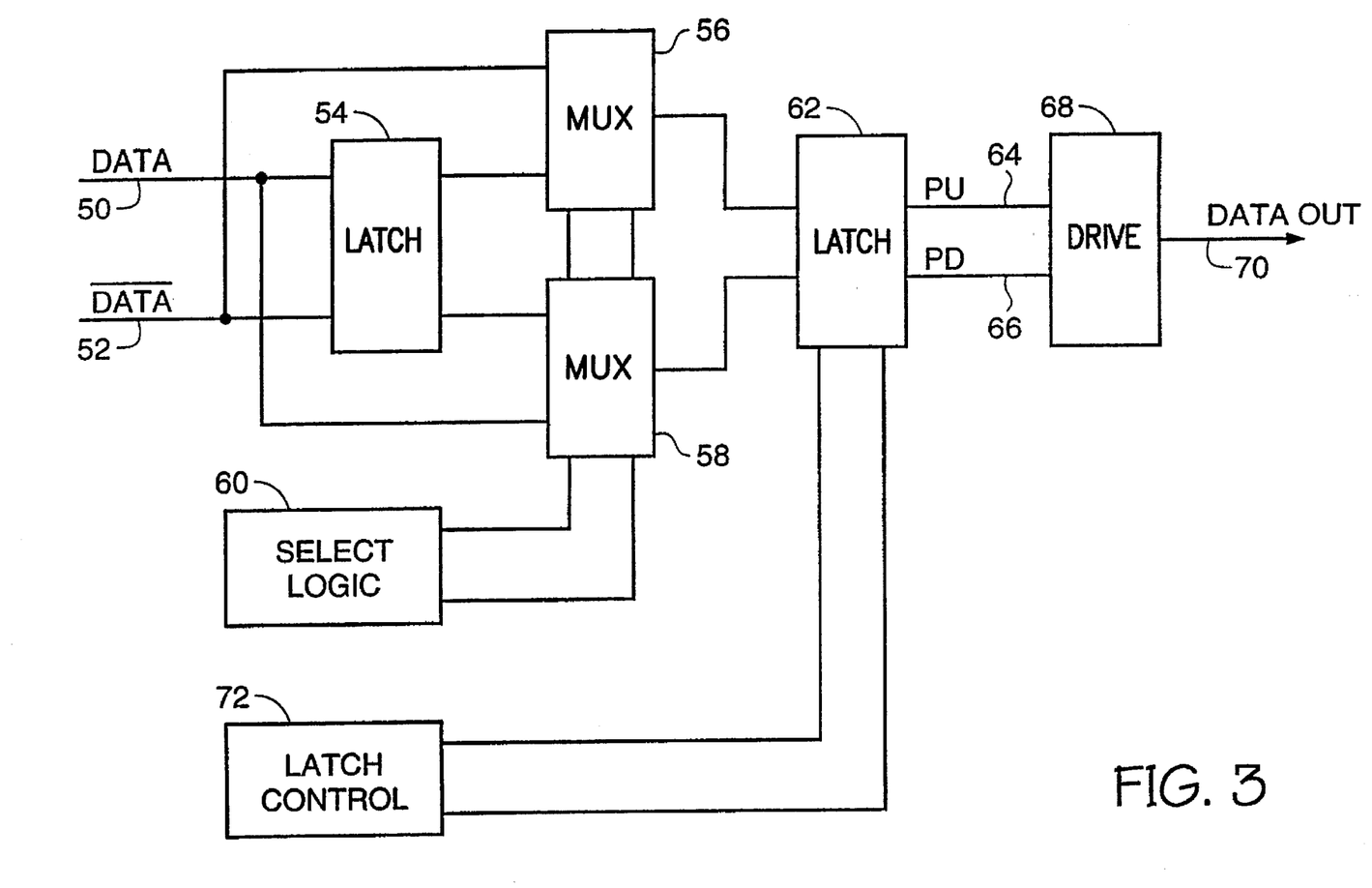
FIG. 3 is an electrical schematic diagram of an output buffer circuit in accordance with the teachings of the present invention.

FIG. 3 is a schematic representation of an output buffer circuit which has both the intermediate data latch and the output data latch. Complimentary internal data signals 50 and 52 from the memory array are latched in intermediate data latch 54 when valid levels are present during a read cycle. The latched data from the intermediate latch may be multiplexed with the unlatched data signals in multiplexers 56 and 58. The unlatched data signals are selected for /CAS latencies equal to one, and for normal EDO page mode operation. For /CAS latencies greater than one, the select logic 60 will select the latched data to pass through the multiplexers to output data latch 62. The select logic may also deselect all inputs to the multiplexers while the output is latched, or in a high impedance state. This may be done for periods of time when the part is not in a read mode, for brief periods of time between read cycles to reduce or eliminate crossing current in the output buffer, or for maintaining the output data through a read cycle. Pullup and pulldown signals 64 and 66 respectively from the output data latch drive output driver 68 which drives a data signal 70 from the device. The latch control circuit 72 controls whether the latch will be cleared (device data outputs in high impedance state), latched, or open to receive data from the multiplexers.

Figure 4:
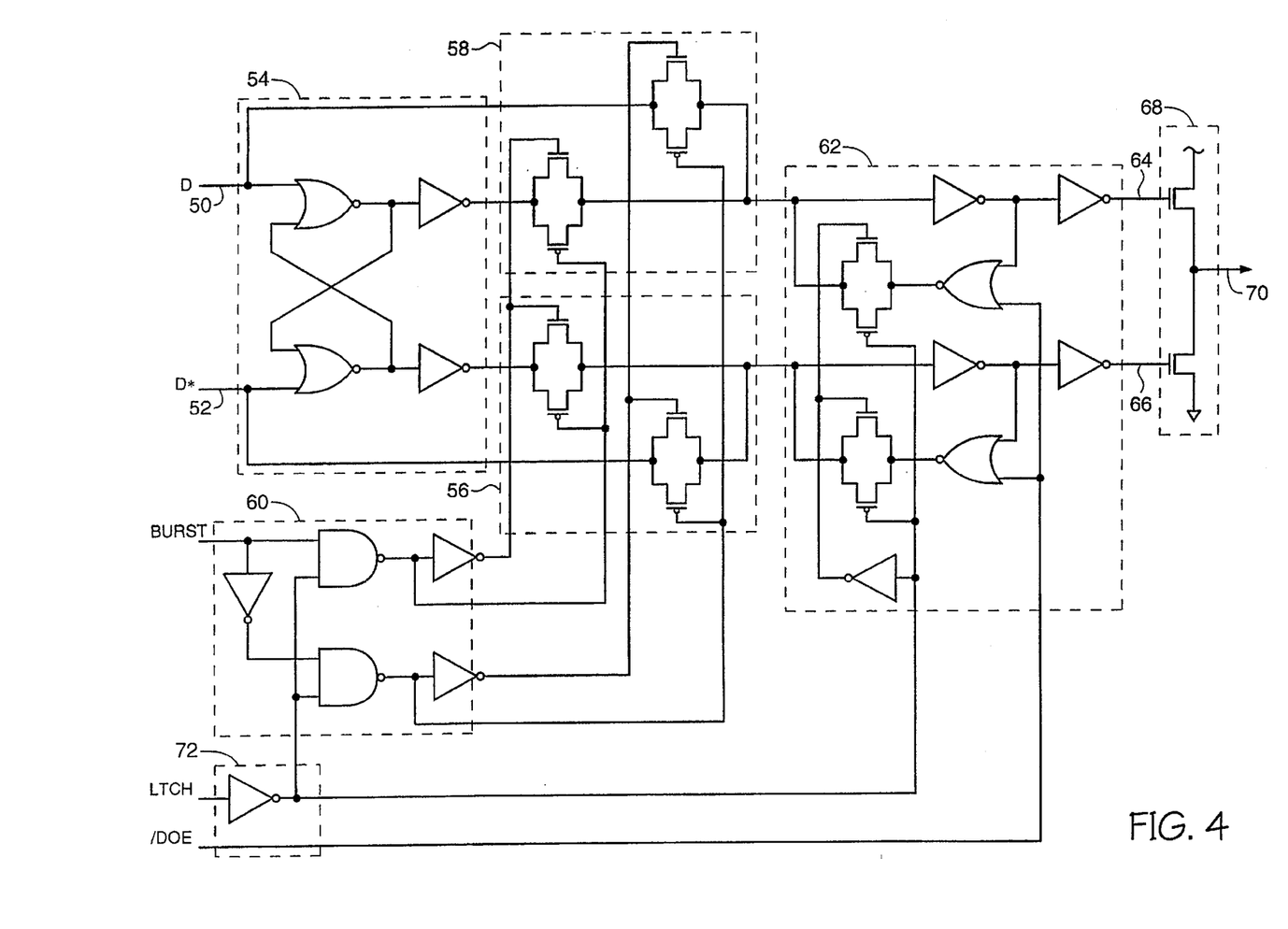
FIG. 4 is a schematic diagram of a specific embodiment of the output buffer circuit of FIG. 3.

FIG. 4 is a more detailed schematic diagram of one embodiment of the output buffer circuit of FIG. 3. While FIG. 4 shows considerably more detail than FIG. 3, it is not intended to be a complete description of all circuit elements that may be present in an output buffer circuit designed in accordance with the teachings of the present invention. The output driver portion 68 for example shows only two control inputs, and two n-channel transistors. Typical output driver circuits are considerably more complex and may include methods to drive full Vcc levels from the device through n-channel output transistors. Numerous semiconductor device output driver circuits are known to those of skill in the art, and therefore it is not deemed necessary to show such detail in this description.

In FIG. 4, complimentary internal data signals D 50 and D* 52 from the memory array are latched in intermediate data latch 54 when valid levels are present during a read cycle. Between read cycles, signals D and D* are driven inactive low. While D and D* are low, the intermediate data latch will maintain its state. When one of the D and D* signals transitions high, the latch will be set or reset. Once the latch is set or reset, D and D* are returned to their low states in preparation for further access cycles. In this particular embodiment, a NOR type intermediate data latch is used. It is equally useful to utilize a NAND type intermediate data latch where D and D* are inactive high, and the latch is triggered upon D or D* transitioning low.

The latched data from the intermediate latch is multiplexed with the unlatched data signals in multiplexers 56 and 58. Multiplexers 56 and 58 each have two sets of n and p channel transistors. When a multiplexer is enabled, only one selected set of the transistors will be turned on in each multiplexer allowing the signal associated with the selected set of transistors to pass through. For burst access cycles, the select logic 60 selects the latched data to pass through the multiplexers to output data latch 62 whenever the latch control signal LTCH is low indicating that the next data is to be driven from the device. The select logic deselects all inputs to the multiplexers (places the multiplexer outputs in a high impedance state) while LTCH is high holding the output data in the output data latch, or while the output data latch is held in a cleared state. In an alternate embodiment, the LTCH and a clear signal /DOE may be logically combined so that the multiplexers tri-state and the output data latch feedback path is formed whenever the /DOE signal is high. This allows for the output data latch to be cleared in response to the /DOE signal despite the state of the LTCH signal. The /DOE data output enable signal is a clear signal in that it disables the output driver 68 from driving data from the device by clearing the output latch which supplies the output driver control inputs. The select logic circuit shown also has a burst mode signal BURST input for selecting between Burst EDO and normal EDO modes of operation.

Pullup and pulldown signals 64 and 66 respectively from the output data latch drive the output driver control inputs of the output driver 68 which drives a data signal 70 from the device. The latch control circuit 72 controls whether the latch will be cleared (device data outputs in high impedance state), latched, or open to receive data from the multiplexers. In the embodiment of FIG. 4, a high level on the /DOE signal will clear the output data latch and tri-state the device output only when then LTCH signal is high. It is possible to design the output data latch such that it is not cleared when the /DOE signal is high in the event that it is deemed desirable drive old data from the output data latch when /DOE transitions low without waiting for /CAS to fall and new data to arrive in the output data latch. Clearing the output data latch allows for the output driver to be maintained in a high impedance state, despite the state of the /DOE signal, until new data is latched in the output data latch by the LTCH signal.

Figure 5:
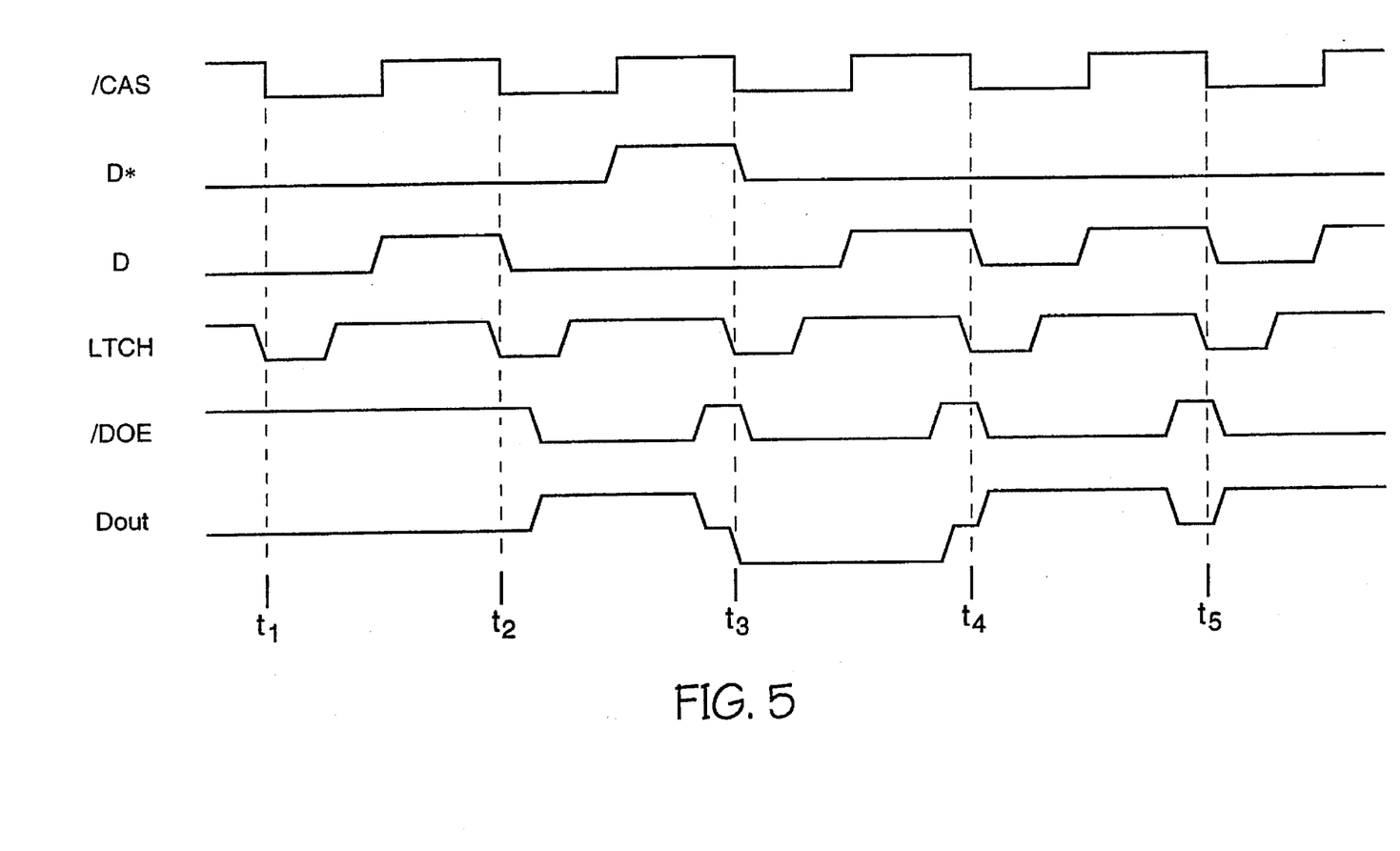
FIG. 5 is a timing diagram of the operation of the circuit of FIG. 4.

FIG. 5 is a timing diagram depicting the operation of the circuit of FIG. 4 after a row of the memory device has been selected. A burst read cycle is shown where an initial column address is latched on the first falling edge of /CAS at time t1. A short time after the first column address is latched, data from the selected row and column of the memory device will be valid on the data lines D and D*. Data signals D and D* are inactive and low prior to the selection of the first column address. In response to the first selected cola, data signal D transitions high indicating a read access of a logic "1" value. The high transition is latched in the intermediate data latch, and remains at the output of the latch even after the data signal D transitions back to a low level in preparation for the selection of a second column of the memory array.

For a burst access cycle the multiplexers 56 and 58 in FIG. 4 select the latched data from the intermediate data latch to pass through to the output data latch whenever the latch control signal LTCH is low and the clear signal /DOE is low. When the LTCH signal is high, the multiplexers are disabled, and data from the output latch is fed back into the output latch circuit. At time t2, LTCH will transition low to allow the data signals from the intermediate data latch to pass into the output data latch in response to the falling edge of /CAS. The first data is then driven from the memory device provided that the /DOE signal is also low. When the LTCH signal transitions back high, the multiplexers are tri-stated, and the output data is latched. The first data value will remain valid external to the memory device until just after the next falling edge of /CAS at time t3. Since data is valid on the second falling edge of /CAS after the address was latched, the /CAS latency is said to be two. Since valid data is not present in the output data latch between times t1 and t2, the data output enable signal /DOE may remain high until shortly after time t2 when it transitions low allowing the memory device output drivers to drive data from the device. If the LTCH signal is allowed to occur at time t1, then the /DOE signal must be used to hold the outupt driver off in order to prevent invalid data from being driven from the device. A third option is to mask the LTCH pulse that is shown at time t1 since no data is being transferred to the output data latch. In the case of the third option, the output data latch having been cleared by /DOE will remain cleared (output drivers mined off) until the next LTCH pulse at time t2 despite /DOE transitioning low prior to t2. /DOE may also pulse high after each failing edge of /CAS for a very short time to turn off the output drivers while the output data latch is changing states in order to prevent large crossing currents in the output driver which occur when both the output pullup and pulldown transistors are mined on at the same time. In the event that other methods are used to reduce or prevent crossing current in the output driver, the /DOE signal may remain low throughout the burst read access as long as the device /OE pin remains low. In a preferred embodiment of the invention, crossing currents are reduced by delaying the turn on of the pulldown driver until after the pullup driver is turned off. In this preferred embodiment, the /DOE signal transitions high and then low between output data values. The high transition occurs slightly before data is valid at the input to the output data latch allowing the output data to swing towards an intermediate potential. When the LTCH signal transitions low, valid data is rapidly driven through the output data latch to the output driver. The /DOE signal then transitions back low prior to the LTCH signal transitioning high.

Also at time t2, an internal address counter provides a second column address to the memory array, and another read access occurs. This second access may occur while the first data is still being latched in the output data latch as long as the intermediate data latch does not latch the second data value prior to the first data being latched in the output data latch. A short time after the second /CAS falling edge, D* transitions high indicating a read access of a logic "0" value.

At time t3 a third column is selected, and the second data value is latched in the output data latch and driven from the part. At time t5, a slight dip is shown in the output data signal between valid logic "1" states from the third and fourth data accesses. This dip is the result of the /DOE signal pulsing high to prevent crossing current in the event that the output data signal would be transitioning. If other methods are used, this dip might not appear. One method of preventing crossing currents in the output drivers is taught in U.S. Pat. No. 5,331,593 to Merritt et. al. In a preferred embodiment of the present invention, crossing currents are reduced by preventing the output driver pulldown from turning on prior to the output driver pullup turning off. In this preferred embodiment, the /DOE signal is allowed to pulse high just prior to data valid in order to allow the output to begin to fall in the event that the previous data out is high. Allowing the output to begin to fall prior to data valid speeds up high to low data transitions which helps to compensate for the high to low transition delay introduced in the reduction of crossing currents. Crossing currents could likewise be reduced by preventing the output driver pullup from turning on prior to the output driver pulldown turning off. However, high to low output transitions tend to be faster than low to high output transitions making the first solution more symmetrical.

Figure 6:
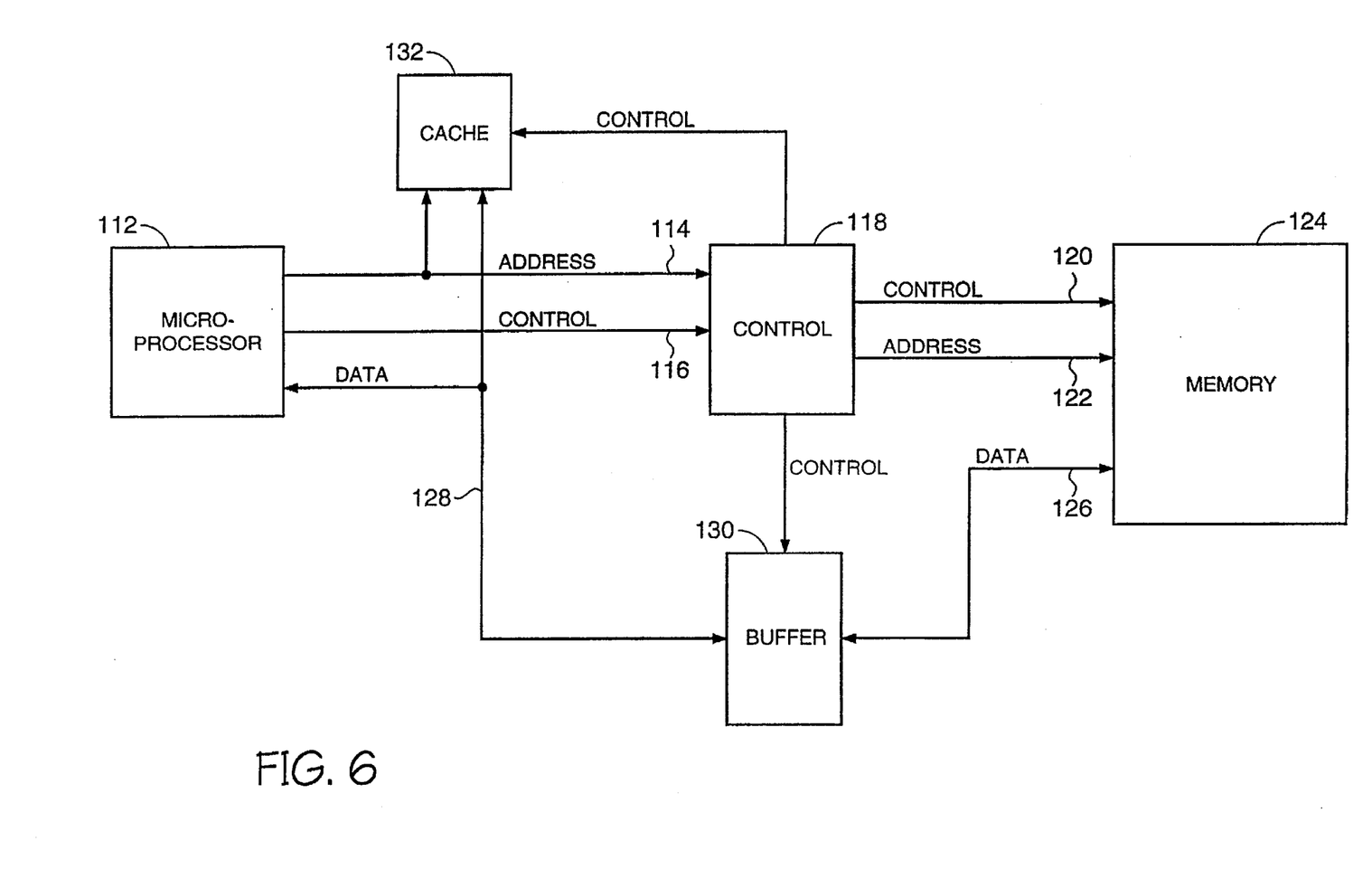
FIG. 6 is a schematic diagram of a microprocessor system in accordance with the present invention.

FIG. 6 is a schematic representation of a data processing apparatus designed in accordance with the present invention. For the purposes of this specification a microprocessor may be, but is not limited to, a microprocessor, a microcontroller, a digital signal processor, or an arithmetic processor. In FIG. 11, microprocessor 112 is connected via address lines 114 and control lines 116 to a memory control circuit 118. The memory control circuit provides address and control signals on lines 122 and 120 respectively to a burst access memory device 124. The burst access memory device sends and receives data over data bus 126. Optional data bus buffer 130 between memory data bus 126 and microprocessor data bus 128 allows for amplification of the data signals, and /or synchronization with the microprocessor and memory control signals. A fast static random access memory (SRAM) cache circuit 132 is also optional and provides higher speed access to data stored in the cache from the memory circuit or the microprocessor. Memory control circuit 118 may be incorporated within the microprocessor. The memory control circuit provides the required address strobe signals, address signals and read/write control signals required for burst mode access of the memory circuit. The capability of the processor to access the memory in a burst mode allows for the design of a computer with relatively high memory bandwidth without the requirement of a fast SRAM cache. SRAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast burst access of main memory in the event of a cache miss.

In operation, the microprocessor reads data from the memory device by supplying address and control signals to the memory device through the memory control circuit. In response to an initial address, a read command and an access cycle strobe, the memory device begins to access a first data word at the initial address. A second access cycle strobe advances the address within the memory device in a second access period of the burst access, and initiates a read access of data from a second address. For a latency of two, the first data is driven from the memory device after the second access cycle strobe signal occurs. Typically the first data is latched in the microprocessor in response to a third access cycle strobe which occurs at the beginning of a third access cycle period of the burst access. The third access cycle strobe also causes the second data value to be driven from the memory device. The third access cycle strobe also causes a third address to be generated within the memory device, and a third data access begins. Data is latched in the microprocessor in response to fourth, fifth and sixth access cycle strobes. In this manner four data values are received in the microprocessor in response to a single address and a plurality of access cycle strobes. The microprocessor may provide a second address to the memory device with the fifth access cycle strobe signal if the memory device is designed to perform four word burst sequences and additional data values are required from the memory. In this case, a second four word burst sequence is begun while the microprocessor is receiving data from the first four word burst. The data buffer 130 may be used to synchronize data from the memory device received in response to the access cycle strobe signal, with a system clock which is connected to the microprocessor. For write cycles, there is typically no latency. Data for write cycles is provided with each access cycle strobe signal in a burst write sequence.

While the present invention has been described with reference to preferred embodiments, numerous modifications and variations of the invention will be apparent to one of skill in the art without departing from the scope of the invention.

What is claimed is:

1. A circuit to drive an output data signal from a memory device, comprising:

an output driver circuit having a driver control input; and a latch adapted to receive a latch control signal and a clear signal; said latch further adapted to receive an internal data signal and drive the driver control input in response to a first state of the latch control signal despite transitions of the clear signal; said latch further adapted to store the internal data signal and drive the driver control input in response to a second state of the latch control signal and a first state of the clear signal; said latch being cleared in response to the second state of the latch control signal and a second state of the clear signal.

2. The circuit of claim 1, wherein the clear control signal clears said latch between cycles in a burst access of the memory device.

3. A circuit to drive an output data signal from a memory device, comprising:

an output driver circuit having a driver control input; and a latch adapted to receive a latch control signal and a clear signal, said latch further adapted to receive an internal data signal and drive the driver control input in response to a first state of the latch control signal, said latch further adapted to store the internal data signal and drive the driver control input in response to a second state of the latch control signal and a first state of the clear signal, said latch being cleared in response to the second state of the latch control signal and a second state of the clear signal, an output feedback switching circuit to feed the driver control input back to an input of said latch, when the latch control signal is in the second state, to form said latch; and an internal data switching circuit to isolate the internal data signal from the input of said latch when said output feedback switching circuit is feeding the driver control input back to the input of said latch.

4. The circuit of claim 3, wherein said latch after being cleared, remains cleared until the internal data signal is presented on the input of said latch.

5. The circuit of claim 1, wherein said output driver circuit provides a high impedance output from the memory device when said latch is cleared.

6. The circuit of claim 1, wherein said latch after being cleared, remains cleared while the latch control signal is in the second state, despite transitions of the clear control signal.

7. The circuit of claim 1, wherein the first state of the latch control signal is a low voltage level, and the first state of the first state of the clear signal is a high voltage level.

8. The circuit of claim 1, wherein the latch comprises:

a feedback circuit coupled to the driver control input and the latch control signal; and switching circuitry connected to the feedback circuit and the latch control signal for coupling a feedback signal to the input of the latch in response to the latch control signal.

9. The circuit of claim 8 wherein the feedback circuit comprises a NOR gate having a first input coupled to the driver control input, a second input connected to the clear signal, and an output connected to the switching circuitry.

10. The circuit of claim 1, wherein the output driver circuit comprises:

a driver transistor having a gate connected to the driver control input and a drain connected to an output.

* * * * *

UNITED STATES PATENT AND TRADEMARK OFFICE
CERTIFICATE OF CORRECTION

PATENT NO. : 5,652,724

DATED : July 29, 1997

INVENTOR(S) : Troy A. Manning

It is certified that error appears in the above-identified patent and that said Letters Patent is hereby corrected as shown below:

At Column 14, line 24, after "clear signal" please insert --said latch comprises--.

Signed and Sealed this

Twenty-first Day of October 1997

Attest:

BRUCE LEHMAN

Attesting Officer

Commissioner of Patents and Trademarks